(12) United States Patent
Buescher et al.

(10) Patent No.: US 6,396,351 B1
(45) Date of Patent: May 28, 2002

(54) PREAMPLIFIER CIRCUIT FOR A PHOTODETECTOR

(75) Inventors: Kevin Scott Buescher; James Harold Lauffenburger; John William Arachtingi, all of Colorado Springs, CO (US)

(73) Assignee: EM (US) Design, Inc, Colorado Springs, CO (US)

( * ) Notice: Subject to any disclaimer, the term of this patent is extended or adjusted under 35 U.S.C. 154(b) by 0 days.

(21) Appl. No.: 09/777,235

(22) Filed: Feb. 5, 2001

(51) Int. Cl.[7] .................................. H03F 3/08
(52) U.S. Cl. .................. 330/308; 330/98; 330/311; 250/214 A
(58) Field of Search ................. 330/308, 257, 330/311, 310, 98, 99, 100, 110; 250/214 A, 214 AG

(56) References Cited

U.S. PATENT DOCUMENTS

| | | | | |
|---|---|---|---|---|
| 3,697,780 A | * | 10/1972 | Michael et al. | 307/235 |
| 3,747,008 A | * | 7/1973 | Zaretsky | 330/110 |
| 5,008,532 A | * | 4/1991 | Ono et al. | 250/222.1 |
| 6,222,418 B1 | * | 4/2001 | Gopinathan et al. | 330/292 |
| 6,246,282 B1 | * | 6/2001 | Oono et al. | 330/86 |

* cited by examiner

Primary Examiner—Robert Pascal
Assistant Examiner—Henry Choe
(74) Attorney, Agent, or Firm—Dale B. Halling

(57) ABSTRACT

An amplifier circuit (20) for a photodetector includes a transconductance variable gain stage (32). The transconductance variable gain stage (32) has an input (34) capable of connecting to the photodetector and an output (40). A transconductance gain stage (44) has an input (42) connected to the output (40) of the transconductance variable gain stage (32). A feedback resistor (46) is connected between an output (48) of the transconductance gain stage (44) and the input (42) of the transconductance gain stage (44).

5 Claims, 3 Drawing Sheets

PREAMPLIFIER CIRCUIT FOR A PHOTODETECTOR

FIELD OF THE INVENTION

The present invention relates generally to the field of amplifier circuits and more particularly to an amplifier circuit for a photodetector.

BACKGROUND OF THE INVENTION

There are a number optical storage standards such as CD (compact disks), DVD (digital video disks), CD-RW (Write/Read CDs), etc. All of these products require photodetector preamplifiers to sense and amplify the reflection from the disks.

There is a trend to build a single machine that can read all of the different standards. Each of these different standards have different amounts of reflectance of the interrogating laser. Thus, a preamplifier circuit designed for one standard is not optimum for a second standard. This can result in misread bits and degrade the performance of the optical storage system. Generally, a preamplifier with adjustable gain is desirable for best performance.

However, the photodetector/preamplifier circuit has a number of other important constraints that make adjustable gain more difficult. The main other constraints include: low-noise amplification, wide signal bandwidth, DC accuracy, relatively large photodetector size, high responsivity, and low cost. These other constraints increase the challenge of providing adjustable gain.

This problem can be demonstrated by an example. A typical photodetector preamplifier circuit is shown in FIG. 1. The photodetector is represented by the current source 14 and the capacitor Cpd, 16. The preamplifier, 10, is represented in its simplest form by the amplifier symbol and the feedback resistor Rf. The gain of the preamplifier is approximately set by the resistor Rf; which converts the input photocurrent to an output voltage, where this conversion factor is called the transimpedance gain. The bandwidth is set by the amplifier characteristics and by the capacitance of the photodiode (plus other parasitic capacitances). The amplifier, plus the resistor RF and the photodetector capacitance Cpd form a feedback loop. This loop is potentially unstable, and the standard stability criteria and calculations (Nyquist, Bode, etc) must be used to guarantee stability over all process, temperature and other production variations. The dominant pole in the loops is usually created by the time constant of the feedback resistor and the photodetector capacitance. In order to achieve the low noise objective, the feedback resistor must be large. In order to achieve wide bandwidth, the amplifier gain must be large enough to move the dominant pole to a high frequency in the closed loop. And, to achieve DC accuracy, the amplifier gain must be quite high at low frequency.

Normally, to achieve DC accuracy and high gain, an amplifier will be constructed in the standard industry practice of an input differential stage, followed by a high gain $2^{nd}$ stage and then frequency-compensated by "Miller" a feedback capacitor across the $2^{nd}$ stage. This produces a standard operational amplifier with DC accuracy, high gain, and possibly wide closed-loop bandwidth. However, using this in a photodetector preamplifier will lead to either reduced bandwidth or to instability. The dominant pole of the operational amplifier, combined with the dominant pole of the Rf, Cpd will result in a $2^{nd}$ order loop. If additional poles and time delays are introduced (as a result of parasitics or other portions of the amplifier), then the result is an oscillator.

The normal methods to reduce this oscillation are: 1) reduce the bandwidth of the amplifier so that it is the dominant pole of the system; 2) reducing the size of Rf to increase the frequency of the Rf Cpd pole; 3) compensate Rf by placing a capacitor in parallel with it; and/or 4) compensate Cpd by placing a resistor in series with it. These solutions all result in sub-optimal preamplifiers; 1 and 2 result in much lower bandwidth, while 3 and 4 result in much higher noise levels.

These problems are made much more difficult when the feedback resistor, Rf needs to be variable. Then, any of these compensation methods is more difficult due to the multiple criteria that must be simultaneously optimized.

It is the object of this present invention to provide: a) an amplifier topology that allows for optimum dynamic range, bandwidth, transimpedance gain, signal to noise ratio, and DC accuracy; b) a means of allowing the transimpedance gain to be varied while the other criteria are optimized.

DETAILED DESCRIPTION OF THE DRAWINGS

An amplifier circuit for a photodetector includes a transconductance variable gain stage. The transconductance variable gain stage has an input capable of connecting to the photodetector and an output. A transconductance gain stage has an input connected to an output of the transconductance variable gain stage. A feedback resistor is connected between an output of the transconductance gain stage and the input of the transconductance gain stage. The transconductance variable gain varies the overall gain of the amplifier circuit. The loop bandwidth is determined by the loop gain from the frequency rolloff of the Rf Cpd timeconstant. As a result the loop bandwidth can be adjusted to compensate for changes of Rf. The net result is that when Rf is changed (in order to vary the transimpedance gain), the transconductance variable gain can also be adjusted in order to maintain the same optimum loop bandwidth. This makes the amplifier circuit ideal for machines designed to handle different optical data formats.

Figure 1:
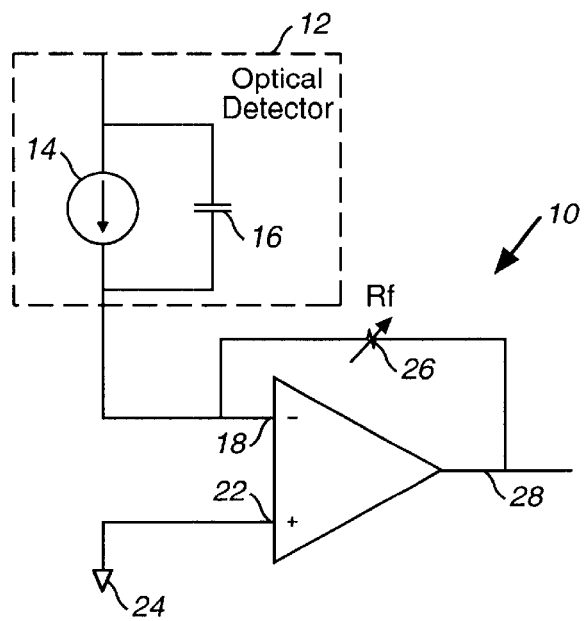
FIG. 1 is a schematic diagram of a transimpedance amplifier circuit connected to an optical detector in accordance with one embodiment of the invention.

FIG. 1 is a schematic diagram of a transimpedance amplifier circuit 10 connected to an optical detector 12 in accordance with one embodiment of the invention. The optical detector 12 is represented as a current source 14 with a parallel capacitance 16. The current source 14 has an output current that is proportional to an input light. The output of the current source 14 is connected to an inverting input 18 of the transimpedance amplifier (operational amplifier) 20. A non-inverting input 22 of the operational amplifier 20 is connected to a ground 24. A feedback resistor 26 is connected between an output 28 of the operational amplifier 20 and the inverting input 18 of the operational amplifier 20. In one embodiment the feedback resistor is a variable resistor.

Figure 2:
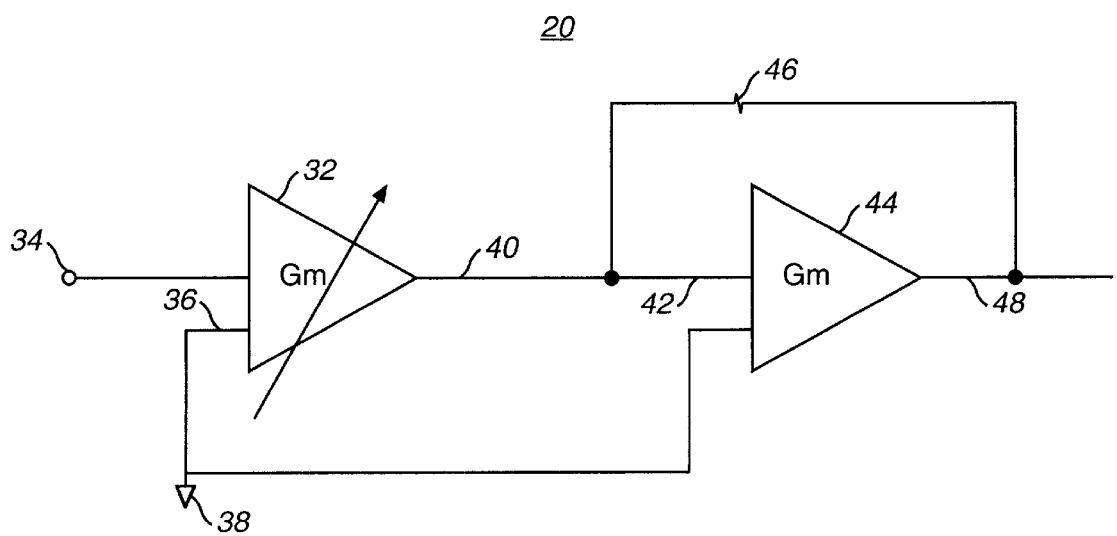
FIG. 2 is a schematic diagram of an amplifier circuit in accordance with one embodiment of the invention.

FIG. 2 is a schematic diagram of an amplifier circuit 20 in accordance with one embodiment of the invention. The overall transimpedance amplifier 20 has a transconductance variable gain stage 32. An input 34 of the transconductance variable gain stage 32 is capable of connecting to a photodetector. A second input 36 of the transconductance variable gain stage 32 is connected to ground 38. An output 40 the transconductance variable gain stage 32 is connected to an input 42 of a transconductance gain stage 44. A feedback resistor 46 is connected between an output 48 and an input 42 of the transconductance gain stage 44. The feedback resistor 46 is not the same as resistor 26 of FIG. 1.

In one embodiment, the total gain of the amplifier is set to have a predetermined zero gain crossing. This is accomplished by changing the feedback resistance 26 when the gain of the transconductance variable gain stage 32 is changed.

Figure 3:
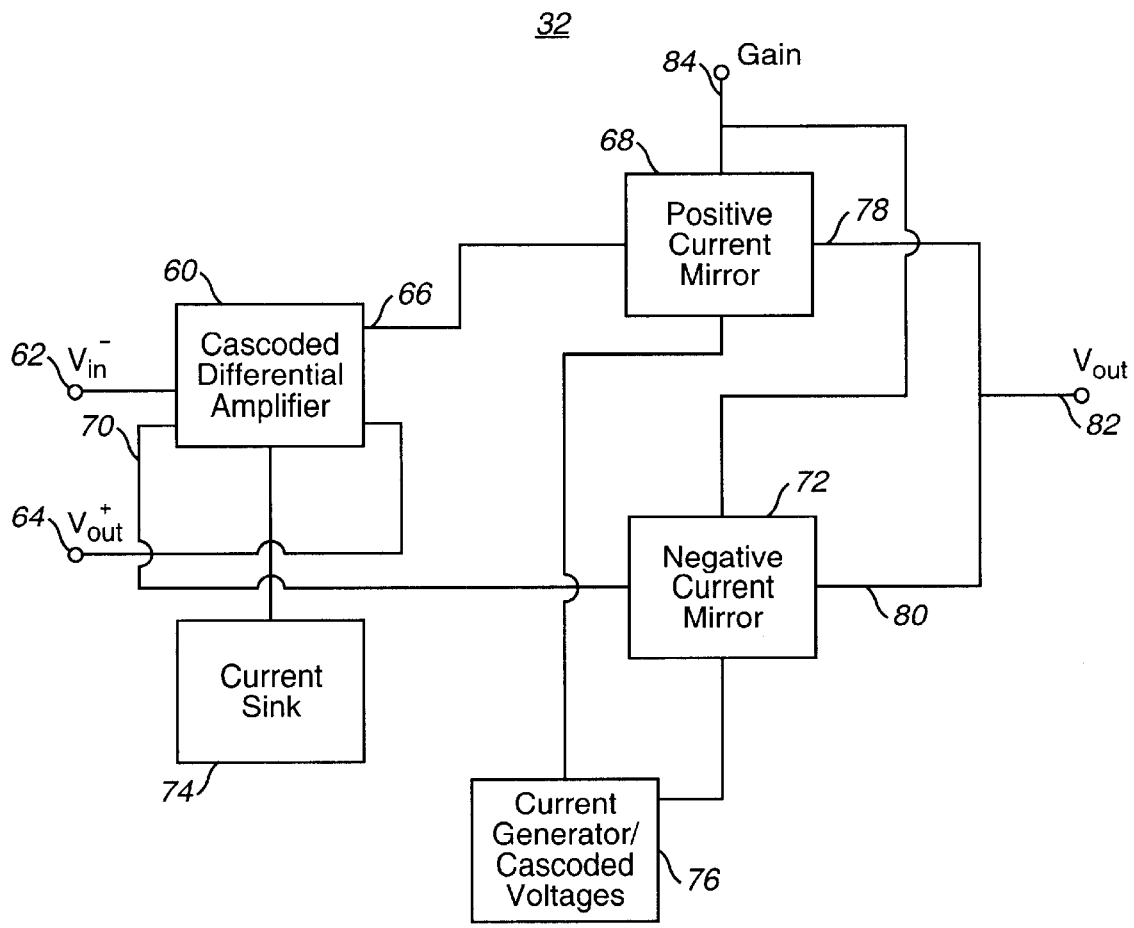
FIG. 3 is a block diagram of a transconductance variable gain stage in accordance with one embodiment of the invention.

FIG. 3 is a block diagram of a transconductance variable gain stage 32 in accordance with one embodiment of the invention. The transconductance variable gain stage 32 has a cascoded differential amplifier 60. The cascoded differential amplifier (differential amplifier) 60 has an inverting input 62 and a non-inverting input 64. A first output 66 of the cascoded differential amplifier 60 is connected to a positive current mirror (positive cascoded current mirror, cascoded current mirror) 68. A second output 70 of the cascoded differential amplifier 60 is connected to the negative current mirror (negative cascoded current mirror) 72. The positive and negative current mirror together may be referred to as the current mirror. A current sink 74 is connected to the cascoded differential amplifier 60. A current generator/cascoded voltages circuit 76 is connected to the positive and negative current mirrors 68, 72. The output 78 of the positive current mirror 68 and the output 80 of the negative current mirror 72 are connected together to form an output 82. The gain of the current mirrors 68, 72 can be changed by a gain signal 84. This is how the gain of the transconductance gain stage 32 is varied. In one embodiment the gain signal 84 is a recording signal. Once the format of the optical storage device is known the recording signal reflects this format.

Figure 4:
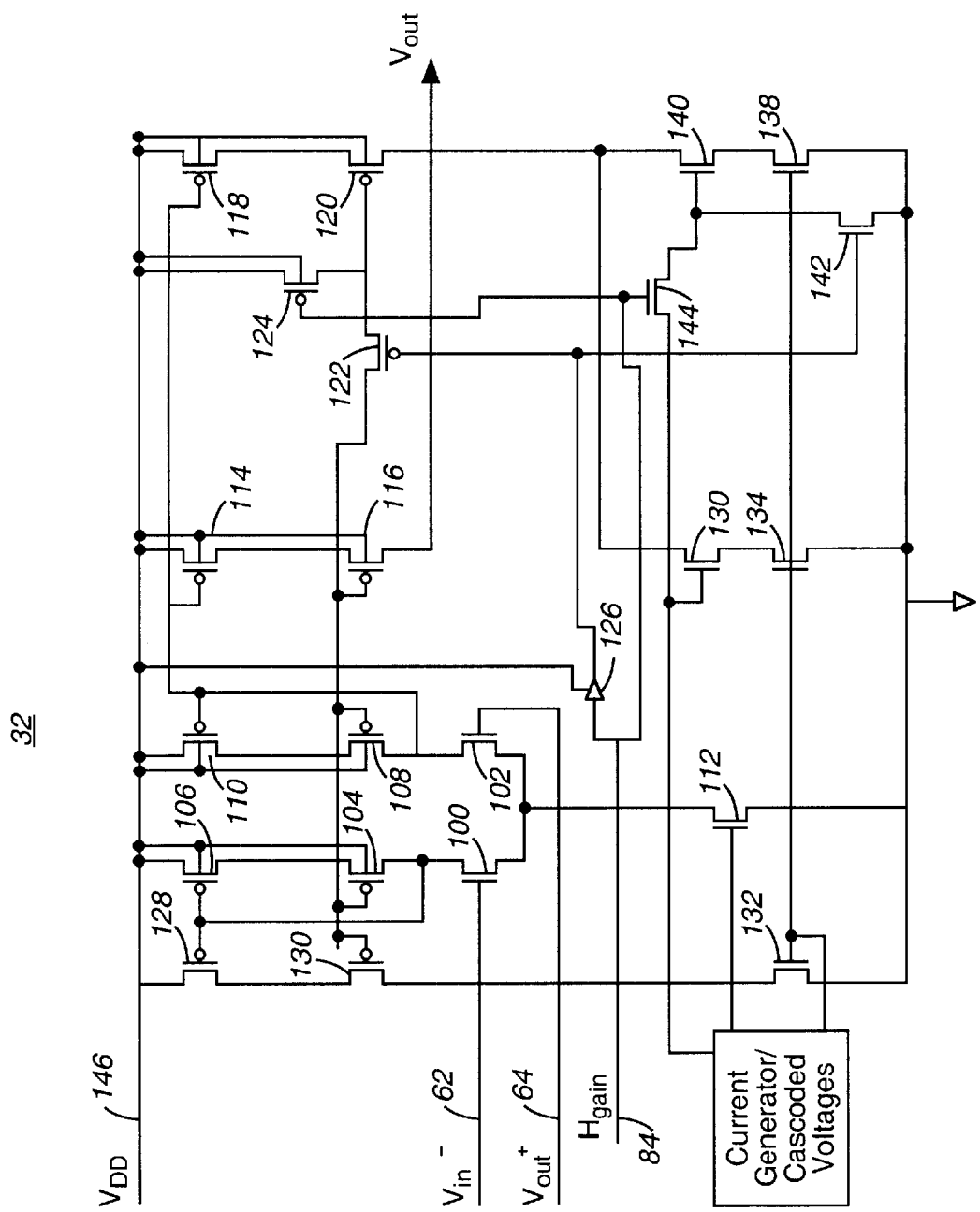
FIG. 4 is a circuit diagram of a transconductance variable gain stage in accordance with one embodiment of the invention.

FIG. 4 is a circuit diagram of a transconductance variable gain stage 32 in accordance with one embodiment of the invention. The inverting input 62 of the transconductance variable gain stage 32 is connected to a first transistor 100. The non-inverting input 64 is connected to a second transistor 102. The first transistor 100 and the second transistor 102 form a differential amplifier. The transistors 104, 106, 108, 110 in combination with the differential amplifier form the cascoded differential amplifier 60. The current sink 74 is implemented as the transistor 112. The positive current mirror 68 is formed by transistors 114, 116, 118, 120. The gain signal 84 controls transistors (gain switch, positive gain switch) 122, 124. An inverter 126 causes one of the transistors 122, 124 to be open while the other transistor is closed. When transistor 124 is closed, transistor 120 does not draw current as a result the positive current mirror only draws current from transistors 114, 116. When transistor 124 is open and transistor 122 is closed transistor 120 draws current. As a result, the positive current mirror draws current from transistors 114, 116, 118, 120. In one embodiment, the current capacity of transistors 118, 120 is twice the current of transistors 114, 116. As a result the high gain mode draws three times the current of the low gain mode.

The transistors 128, 130, 132 transfer the current from transistors 104, 106 to the negative current mirror 72. The negative current mirror 72 is formed by transistors 134, 136, 138, 140. The gain switch (negative gain switch) is formed by transistors 142, 144. The negative current mirror works essentially the same as the positive current mirror. The current generator/cascoded voltages circuit 76 powers the current mirrors and various transistors. Power is provided by the input voltage 146.

Thus there has been described an amplifier circuit for a photodetector that has a variable gain necessary to compensate for varying input light levels. When this circuit is used with optical storage devices, it allows a single device to accurately play a variety of different optical storage devices (formats).

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An amplifier circuit for a photodetector comprising:
   a transconductance variable gain stage having an input capable of connecting to the photodetector and an output;
   a transconductance gain stage having an input directly connected to the output of the transconductance variable gain stage; and
   a feedback resistor connected between an output of the transconductance gain stage and the input of the transconductance gain stage.

2. The amplifier circuit of claim 1, wherein a gain of the transconductance variable gain stage is set to have a predetermined zero gain frequency crossing.

3. The amplifier circuit of claim 1, wherein the transconductance variable gain stage has a second input connected to a ground.

4. An amplifier circuit for a photodetector comprising:
   a transconductance variable gain stage having an input capable of connecting to the photodetector;
   a transconductance gain stage having an input connected to an output of the transconductance variable gain stage;
   a feedback resistor connected between an output of the transconductance gain stage and the input of the transconductance gain stage; and
   a variable feedback resistor connected to the input of the transconductance variable gain stage and to the output of the transconductance gain stage.

5. The amplifier circuit of claim 4, wherein the transconductance variable gain stage includes a differential amplifier.

* * * * *